US012725670B2

(12) United States Patent
Peng et al.

(10) Patent No.: US 12,725,670 B2
(45) Date of Patent: Sep. 1, 2026

(54) HIGH-VOLTAGE BLOCKING DEVICE, THREE-DIMENSIONAL MEMORY, AND PREPARATION METHOD THEREOF

(71) Applicant: Chengdu PBM Technology Ltd, Chengdu (CN)

(72) Inventors: Jack Zezhong Peng, Chengdu (CN); Ke Wang, Chengdu (CN)

(73) Assignee: Chengdu PBM Technology Ltd, Chengdu (CN)

( * ) Notice: Subject to any disclaimer, the term of this patent is extended or adjusted under 35 U.S.C. 154(b) by 233 days.

(21) Appl. No.: 18/727,775

(22) PCT Filed: Nov. 27, 2023

(86) PCT No.: PCT/CN2023/134378
§ 371 (c)(1),
(2) Date: Jul. 10, 2024

(87) PCT Pub. No.: WO2025/076935
PCT Pub. Date: Apr. 17, 2025

(65) Prior Publication Data
US 2026/0188401 A1 Jul. 2, 2026

(30) Foreign Application Priority Data
Oct. 9, 2023 (CN) ......................... 202311298985.6

(51) Int. Cl.
*G11C 7/22* (2006.01)
*G11C 17/16* (2006.01)
*H10B 20/25* (2023.01)

(52) U.S. Cl.
CPC ............. *G11C 17/16* (2013.01); *H10B 20/25* (2023.02)

(58) Field of Classification Search
CPC ................................ G11C 17/16; H10B 20/25
(Continued)

(56) References Cited

U.S. PATENT DOCUMENTS 7,764,532 B2 * 7/2010 Kurjanowicz ......... G11C 17/16 365/96
8,273,610 B2 * 9/2012 Or-Bach ................. H10P 72/74 257/E23.101
(Continued)

FOREIGN PATENT DOCUMENTS

CN 101236780 A 8/2008
CN 103928609 A 7/2014
(Continued)

OTHER PUBLICATIONS

International Search Report for Application No. PCT/CN2023/134378 mailed Apr. 24, 2024. 4 pages.

*Primary Examiner* — Tha-O H Bui
(74) *Attorney, Agent, or Firm* — Lerner David LLP

(57) ABSTRACT

Provided are a high-voltage blocking device (HVBD), a three-dimensional memory, and a preparation method thereof, relating to the technical field of three-dimensional memory manufacturing. The HVBD layer is provided with a plurality of vertical MOS through-holes; HVBDs are embedded in the HVBD layer through the corresponding vertical MOS through-holes; the HVBD layer includes a decoder array connection layer, a gate control layer, and a bit line connection layer that are sequentially arranged from bottom to top; the decoder array connection layer, the gate control layer, and the bit line connection layer are each provided with a plurality of MOS through-holes. This application, by embedding the HVBDs between a bit line decoder array and a three-dimensional stacked memory array, can reduce a planar area occupied by the three-dimensional memory while preventing electrical breakdown of a gate insulating layer of a bit line selection transistor.

15 Claims, 12 Drawing Sheets

(58) Field of Classification Search
USPC .................................................... 365/189.011
See application file for complete search history.

(56) References Cited

U.S. PATENT DOCUMENTS

| | | | | |
|---|---|---|---|---|
| 8,754,533 | B2 * | 6/2014 | Or-Bach .............. | H10D 84/038 257/797 |
| 11,710,728 | B2 * | 7/2023 | Choi ...................... | G11C 16/24 365/185.13 |
| 2015/0069377 | A1 | 3/2015 | Rabkin et al. | |
| 2015/0263074 | A1 | 9/2015 | Takaki | |
| 2022/0139443 | A1 | 5/2022 | Kim et al. | |
| 2022/0285393 | A1 | 9/2022 | Young et al. | |
| 2025/0126800 | A1 | 4/2025 | Peng et al. | |

FOREIGN PATENT DOCUMENTS

| | | | |
|---|---|---|---|
| CN | 105359270 | A | 2/2016 |
| CN | 114664862 | A | 6/2022 |
| CN | 115843176 | A | 3/2023 |
| CN | 116322048 | A | 6/2023 |

* cited by examiner

1
WL_A
Aa Ab Ac Ad
WL_B
Ba Bb Bc Bd
WL_C
Ca Cb Cc Cd
BL_a BL_b BL_c BL_d
G D S
2
"1" "0" "0" "0" "0" "0" "0" "0"
3

12
9
6
7
8

HIGH-VOLTAGE BLOCKING DEVICE, THREE-DIMENSIONAL MEMORY, AND PREPARATION METHOD THEREOF

CROSS REFERENCE TO RELATED APPLICATION

The present application is a national stage application of International Patent Application No. PCT/CN2023/134378, filed on Nov. 27, 2023, which claims priority to the Chinese Patent Application No. 202311298985.6, filed with the China National Intellectual Property Administration (CNIPA) on Oct. 9, 2023, and entitled "HIGH-VOLTAGE BLOCKING DEVICE, THREE-DIMENSIONAL MEMORY, AND PREPARATION METHOD THEREOF", which are incorporated herein by reference in their entireties.

TECHNICAL FIELD

The present disclosure relates to the technical field of three-dimensional memory manufacturing, and in particular, to a high-voltage blocking device (HVBD), a three-dimensional memory, and a preparation method thereof.

BACKGROUND

In three-dimensional (3D) memory devices, a vertical bit line (BL) is selected by a bit line decoder array in an underlying circuit, where the selection transistors in the bit line decoder array are typically metal oxide semiconductor (MOS) transistors. If the MOS transistors in the bit line decoder array are 2.5V transistors, a relatively large area is occupied, which affects the further reduction of critical dimensions of the three-dimensional memory. If the underlying circuit adopts 1.1V MOS transistors, although the occupied area is reduced, the thickness of a MOS gate insulating layer will be correspondingly reduced, posing a risk of breakdown of the gate insulating layer. For example, during operation, if a programming voltage (i.e., Vp, 6V-6.5V) is applied to program a word line (WL) and memory cells corresponding to multiple BLs simultaneously, the successfully programmed cell will be in a low-resistance state, causing the corresponding BL voltage to be pulled to a high voltage close to Vp by the WL voltage, resulting in a bias of 4.9-5.4V across the gate insulating layer of the MOS selection transistor, where the gate voltage is 1.1V (i.e., the operating voltage of the MOS transistor) and the BL voltage is approximately 6V-6.5V (close to Vp). In this case, the voltage drop across the insulating layer may easily cause electrical breakdown of the gate insulating layer of the selected transistor.

SUMMARY

An objective of the present disclosure is to provide a HVBD, a three-dimensional memory, and a preparation method thereof. The HVBD is applied to a three-dimensional memory, to reduce a planar area occupied by the three-dimensional memory while preventing electrical breakdown of a gate insulating layer of a bit line selection transistor.

To achieve the above objective, the present disclosure provides the following technical solutions.

A HVBD is provided. The HVBD is applied to a three-dimensional memory, and the three-dimensional memory includes a bit line decoder array layer, a HVBD layer, and a one-time programmable (OTP) array layer that are sequentially arranged from bottom to top.

MOS bit line selection transistors in the bit line decoder array layer are connected to vertical bit lines of OTP devices in the OTP array layer in a one-to-one corresponding manner through the HVBDs in the HVBD layer; the HVBD is a vertical MOS transistor.

The HVBD layer includes a plurality of HVBDs.

A plurality of vertical MOS through-holes are provided on the HVBD layer; the HVBDs are arranged to be in a one-to-one correspondence with the vertical MOS through-holes; the HVBDs are embedded in the HVBD layer through the corresponding vertical MOS through-holes.

The HVBD layer includes a decoder array connection layer, a gate control layer, and a bit line connection layer that are sequentially arranged from bottom to top.

The decoder array connection layer, the gate control layer, and the bit line connection layer are each provided with a plurality of MOS through-holes; the MOS through-holes on the decoder array connection layer, the MOS through-holes on the gate control layer, and the MOS through-holes on the bit line connection layer are in a one-to-one correspondence and coaxially arranged; the vertical MOS through-holes include the MOS through-holes on the decoder array connection layer, the MOS through-holes on the gate control layer, and the MOS through-holes on the bit line connection layer that are coaxially arranged.

According to specific embodiments provided in the present disclosure, the present disclosure has the following technical effects:

The present disclosure provides a HVBD, a three-dimensional memory, and a preparation method thereof. The HVBD is applied to a three-dimensional memory. A plurality of vertical MOS through-holes are provided on the HVBD layer. The HVBDs are arranged to be in a one-to-one correspondence with the vertical MOS through-holes; the HVBDs are embedded in the HVBD layer through the corresponding vertical MOS through-holes. The HVBD layer includes a decoder array connection layer, a gate control layer, and a bit line connection layer that are sequentially arranged from bottom to top. The decoder array connection layer, the gate control layer, and the bit line connection layer are each provided with a plurality of MOS through-holes. The MOS through-holes on the decoder array connection layer, the MOS through-holes on the gate control layer, and the MOS through-holes on the bit line connection layer are in a one-to-one correspondence and coaxially arranged. The vertical MOS through-holes include the MOS through-holes on the decoder array connection layer, the MOS through-holes on the gate control layer, and the MOS through-holes on the bit line connection layer that are coaxially arranged. The present disclosure, by setting the HVBDs between a bit line decoder array and a three-dimensional stacked memory array, can reduce a planar area occupied by the three-dimensional memory while preventing electrical breakdown of a gate insulating layer of a bit line selection transistor.

Figures 1, 2:
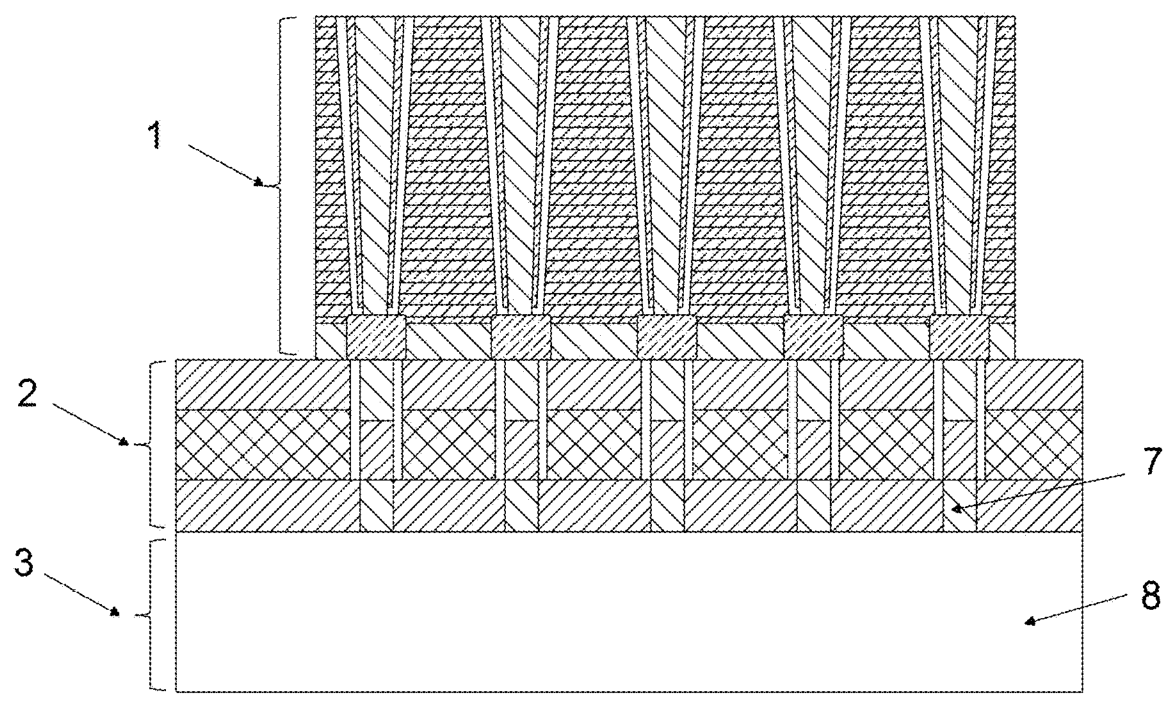
FIG. 1 is a schematic structural diagram of a three-dimensional memory using HVBDs according to Embodiment 1 of the present disclosure.
FIG. 2 is an equivalent circuit diagram of a three-dimensional memory using HVBDs according to Embodiment 1 of the present disclosure.

Reference numerals: 1: OTP array; 2: HVBD layer; 3: bit line decoder array layer; 4: drain; 5: gate; 6: source; 7: bit line pillar connection; 8: underlying circuit; 9: gate electrode material; 10: drain insulating material; 11: vertical MOS through-hole; 12: gate insulating material; 13: MOS channel material; 14: drain material region; 15: source layer insulating material; 16: source material region.

DETAILED DESCRIPTION OF THE EMBODIMENTS

The technical solutions of the embodiments of the present disclosure are clearly and completely described below with reference to the drawings in the embodiments of the present disclosure. Apparently, the described embodiments are merely a part rather than all of the embodiments of the present disclosure. All other embodiments obtained by those skilled in the art based on the embodiments of the present disclosure without creative efforts shall fall within the protection scope of the present disclosure.

An objective of the present disclosure is to provide a HVBD, a three-dimensional memory, and a preparation method thereof. The HVBD is applied to a three-dimensional memory, to reduce a planar area occupied by the three-dimensional memory while preventing electrical breakdown of a gate insulating layer.

In order to make the above objective, features and advantages of the present disclosure clearer and more comprehensible, the present disclosure will be further described in detail below in combination with accompanying drawings and particular implementation modes.

Embodiment 1

As shown in FIG. 1 to FIG. 2, the present disclosure provides a HVBD. The HVBD is applied to a three-dimensional memory. The three-dimensional memory includes a bit line decoder array layer 3, a HVBD layer 2, and a OTP array layer 1 that are sequentially arranged from bottom to top. MOS bit line selection transistors in the bit line decoder array layer are connected to vertical bit lines of OTP devices in the OTP array layer in a one-to-one corresponding manner through the HVBDs in the HVBD layer. The HVBD is a vertical MOS transistor. The HVBD layer includes a plurality of HVBDs. A plurality of vertical MOS through-holes are provided on the HVBD layer. The HVBDs are arranged to be in a one-to-one correspondence with the vertical MOS through-holes; the HVBDs are embedded in the HVBD layer through the corresponding vertical MOS through-holes. The HVBD layer includes a decoder array connection layer, a gate control layer, and a bit line connection layer that are sequentially arranged from bottom to top. The decoder array connection layer, the gate control layer, and the bit line connection layer are each provided with a plurality of MOS through-holes. The MOS through-holes on the decoder array connection layer, the MOS through-holes on the gate control layer, and the MOS through-holes on the bit line connection layer are in a one-to-one correspondence and coaxially arranged. The vertical MOS through-holes 11 include the MOS through-holes on the decoder array connection layer, the MOS through-holes on the gate control layer, and the MOS through-holes on the bit line connection layer that are coaxially arranged. The MOS through-hole is rectangular, elliptical, circular, or the like.

The HVBD includes: a MOS channel material region and a drain (4) material region sequentially arranged from bottom to top in the vertical MOS through-hole, with the MOS channel material region embedded in the gate (5) control layer. The drain material region 14 is embedded in the bit line connection layer. A bit line pillar connection led out from the MOS selection transistor in the bit line decoder array layer is embedded in the decoder array connection layer. The bit line pillar connection is in contact with a lower surface of the MOS channel material region, and an upper surface of the drain material region is in contact with the vertical bit line of the OTP device in the OTP array layer. An upper surface of the MOS channel material region is in contact with a lower surface of the drain material region, allowing the MOS selection transistor in the bit line decoder array layer to be correspondingly connected to the vertical bit line of the OTP device in the OTP array layer via the HVBD. Side surfaces of the MOS channel material region and the drain material region are covered with a gate insulating material. The HVBD layer further includes a source (6) layer. The source layer is positioned under the gate control layer. The source layer is provided with a plurality of MOS through-holes. The MOS through-holes on the decoder array connection layer, the MOS through-holes on the source layer, the MOS through-holes on the gate control layer, and the MOS through-holes on the bit line connection layer are in a one-to-one correspondence and coaxially arranged. The MOS through-hole on the decoder array connection layer, the MOS through-hole on the insulating material layer, the MOS through-hole on the gate control layer, and the MOS through-hole on the bit line connection layer together form a vertical MOS through-hole.

Figure 3:
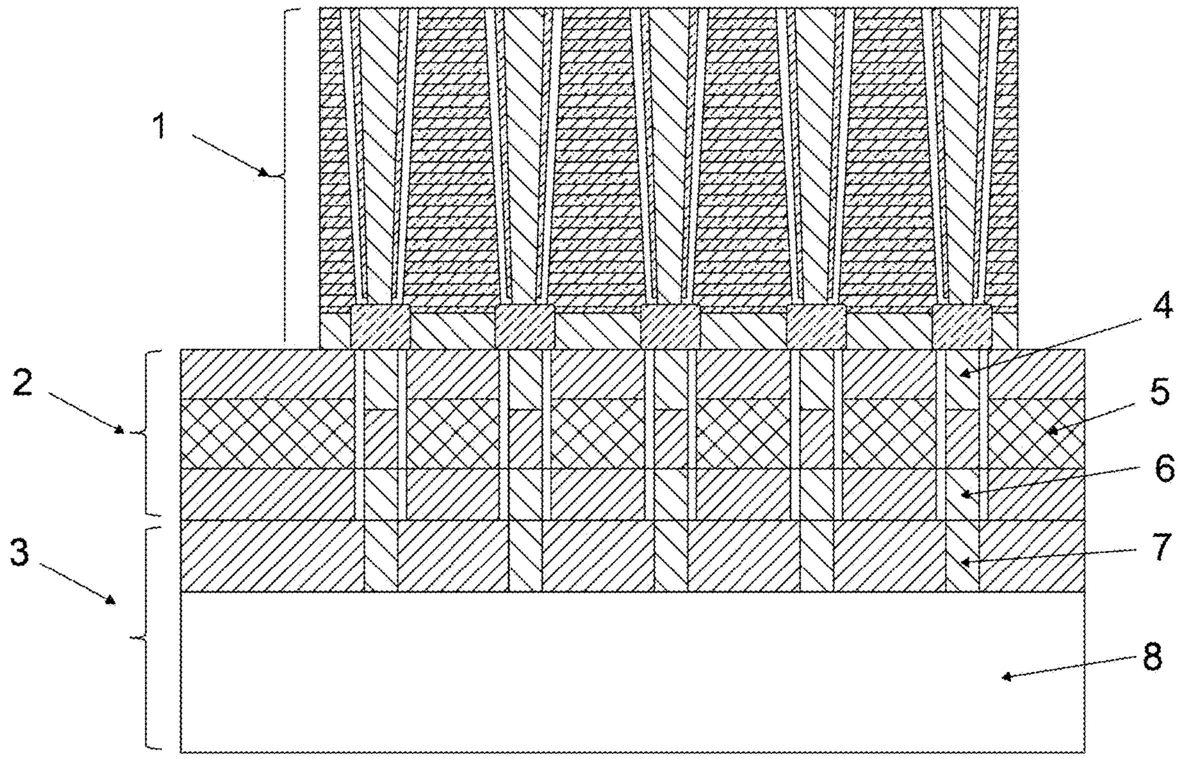
FIG. 3 is a schematic structural diagram of a three-dimensional memory using HVBDs according to Embodiment 2 of the present disclosure.

Alternatively, as shown in FIG. 3, the HVBD includes: a source material region, a MOS channel material region, and a drain material region sequentially arranged from bottom to top in the vertical MOS through-hole. The source material region is embedded in the source layer, the MOS channel material region is embedded in the gate control layer, and the drain material region is embedded in the bit line connection layer. A bit line pillar connection led out by the MOS selection transistor in the bit line decoder array layer is embedded in the decoder array connection layer, and is in contact with a lower surface of the source material region. An upper surface of the drain material region is in contact with the vertical bit line of the OTP device in the OTP array layer. The source material region, the MOS channel material region, and the drain material region are in contact successively, allowing the MOS selection transistor in the bit line decoder array layer to be correspondingly connected to the vertical bit line of the OTP device in the OTP array layer via the HVBD. Side surfaces of the source material region, the MOS channel material region, and the drain material region are covered with the gate insulating material.

A main part of the gate control layer is made of a gate electrode material; and the main part is the region of the gate control layer expect for the MOS channel material region and the gate insulating material. The gate electrode material is made of heavily-doped polysilicon; the gate insulating material is silicon dioxide; the source material region is made of heavily-doped n-type polysilicon; the bit line pillar connection 8 is made of heavily-doped n-type polysilicon; the MOS channel material region is made of lightly-doped p-type polysilicon; and the drain material region is made of heavily-doped n-type polysilicon.

Embodiment 2

This embodiment provides a three-dimensional memory, to which the HVBD described in Embodiment 1 is applied.

Embodiment 3

Figure 4:
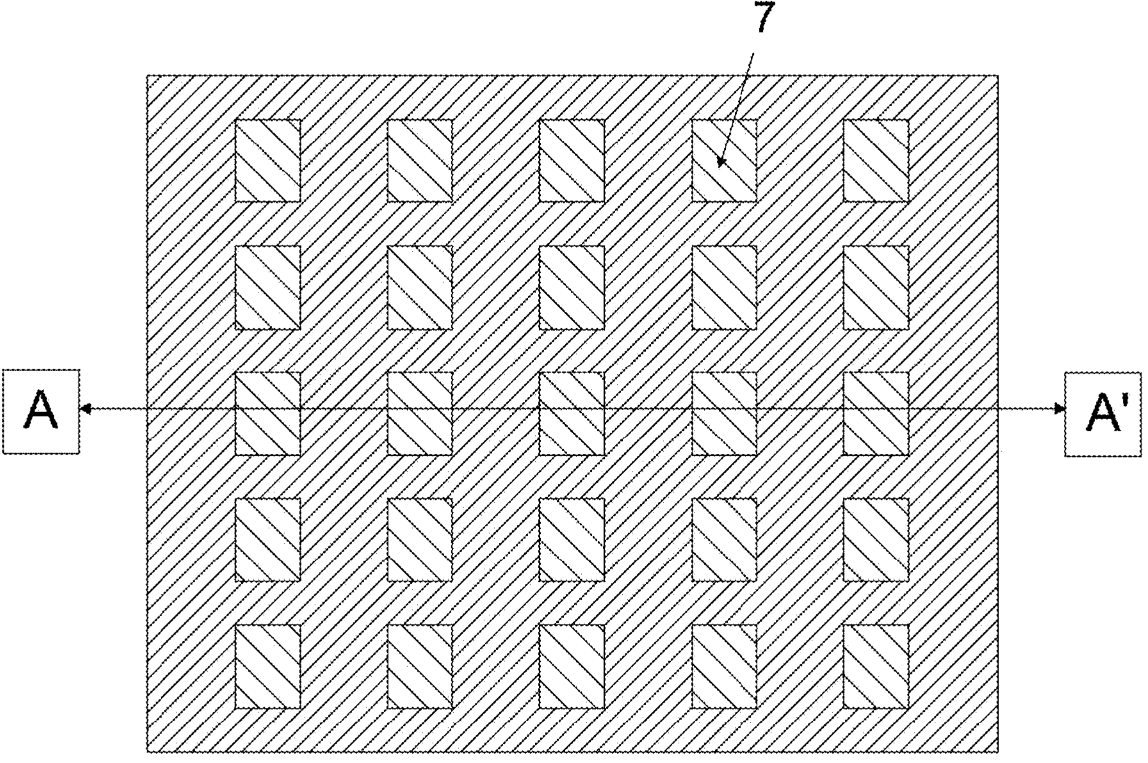
FIG. 4 is a schematic top view of a bit line decoder array of a multi-layer memory according to Embodiment 3 of the present disclosure.
Figure 5:
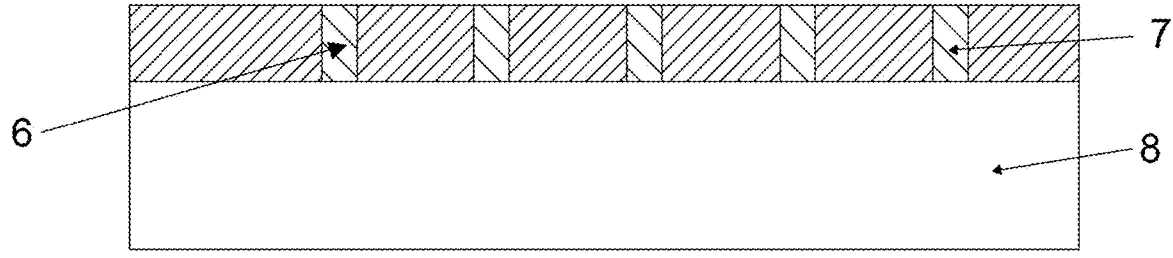
FIG. 5 is a schematic diagram of a positional relationship between a decoder array connection layer and an underlying circuit of a multi-layer memory according to Embodiment 3 of the present disclosure.

This embodiment provides a preparation method for a three-dimensional memory, including the following steps:

Step 1: Preparation of a bit line decoder array layer: prepare an underlying circuit 7 containing the bit line decoder array layer, where bit line pillar connections are located at a top layer of the underlying circuit, as shown in FIG. 4 to FIG. 5. The top layer of the underlying circuit, which contains the bit line pillar connections, serves as the decoder array connection layer of HVBDs. The bit line pillar connections are in a one-to-one correspondence with positions of subsequent vertical MOS through-holes. The bit line pillar connection is generally an extension part of a drain of a MOS selection transistor in the underlying circuit, and can be made of an n-type or a p-type conductor/semiconductor. To cooperate with the application of the vertical MOS transistor of the HVBD, a low-resistance n-type semiconductor or n+ polysilicon (or a low-resistance p-type semiconductor or p+ polysilicon) can be used.

Step 2: Deposit a gate electrode material on the decoder array connection layer to obtain initial gate electrode material regions 9, where a gate electrode material (such as n+ poly-Si) is deposited on the decoder array connection layer to obtain initial gate electrode material regions. Deposition can be carried out using a Chemical Vapor Deposition (CVD) or an Atomic Layer Deposition (ALD) technique.

Figure 6:
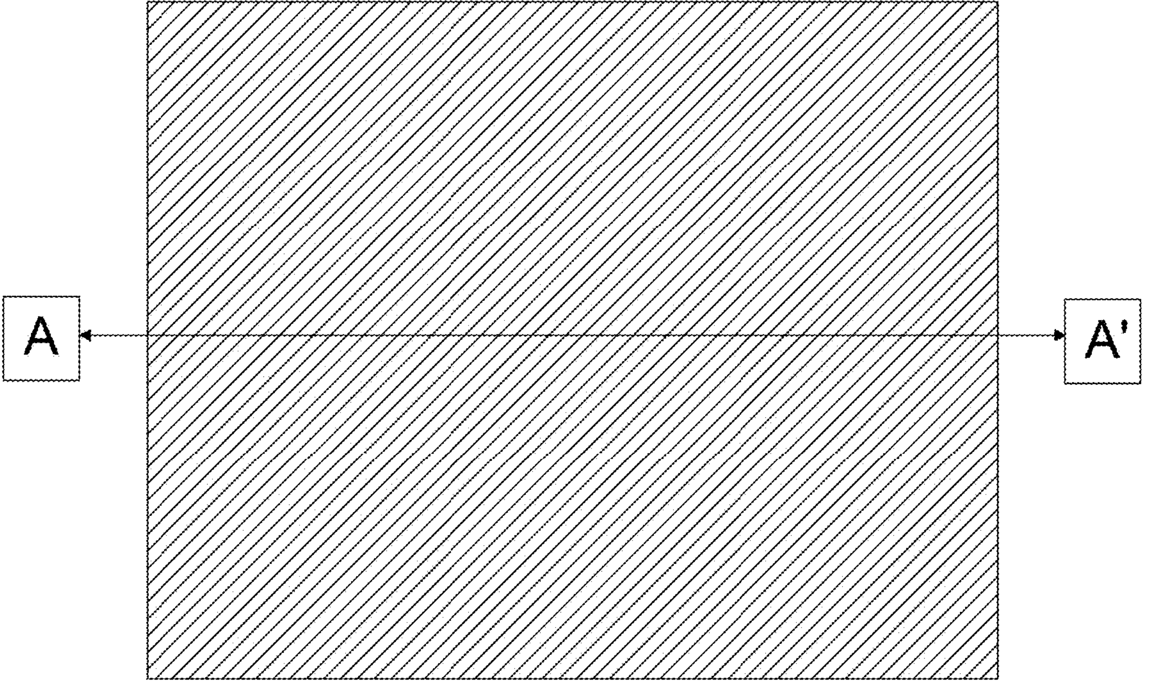
FIG. 6 is a first schematic diagram of an intermediate process for preparing a three-dimensional memory according to Embodiment 3 of the present disclosure.
Figure 7:
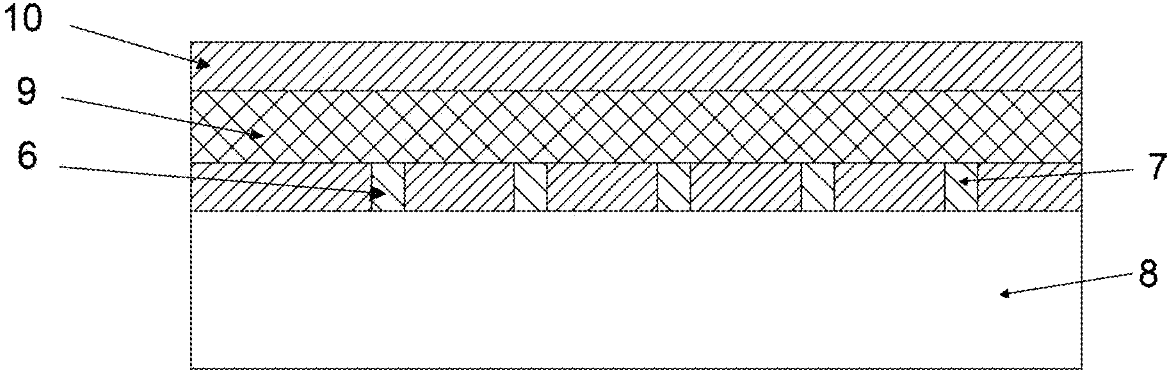
FIG. 7 is a second schematic diagram of an intermediate process for preparing a three-dimensional memory according to Embodiment 3 of the present disclosure.

Step 3: Deposit a drain insulating material on the initial gate electrode material layer to obtain initial drain insulating material regions 10, where a drain insulating material (such as $SiO_2$) is deposited on the initial gate electrode material layer to obtain initial drain insulating material regions, as shown in FIG. 6 to FIG. 7. Deposition can be carried out using a Chemical Vapor Deposition (CVD) or an Atomic Layer Deposition (ALD) technique.

Figure 8:
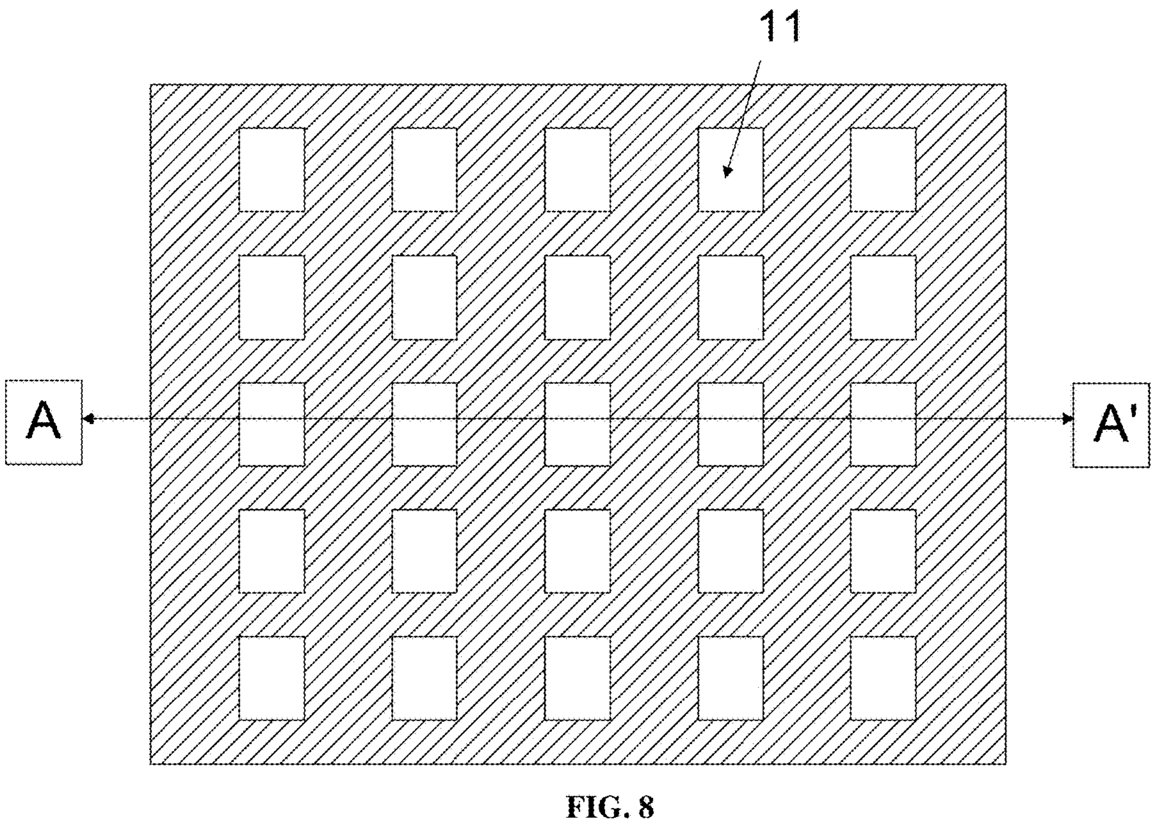
FIG. 8 is a third schematic diagram of an intermediate process for preparing a three-dimensional memory according to Embodiment 3 of the present disclosure.
Figure 9:
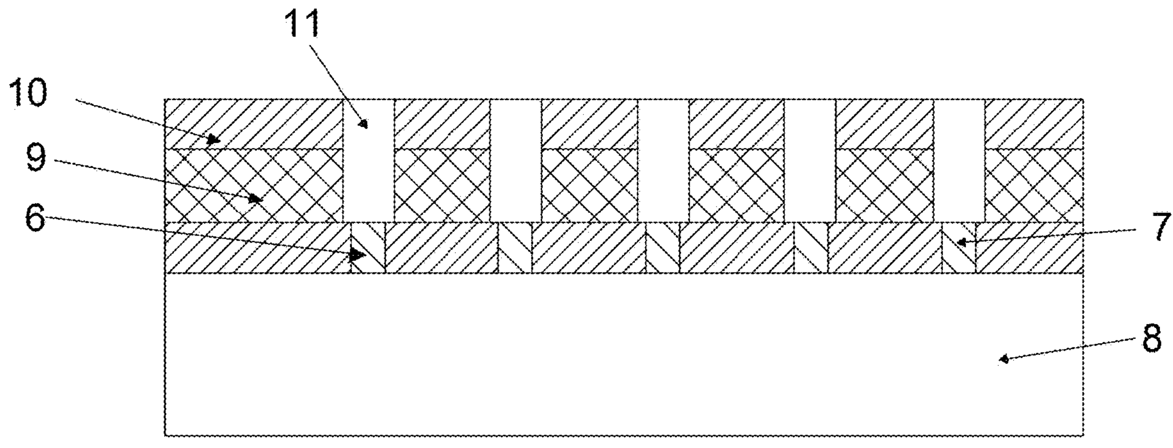
FIG. 9 is a fourth schematic diagram of an intermediate process for preparing a three-dimensional memory according to Embodiment 3 of the present disclosure.

Step 4: Etch MOS through-holes at positions corresponding to the MOS through-holes in the initial gate electrode material regions and the initial drain insulating material regions to obtain gate electrode material regions and drain insulating material regions, where the gate electrode material region has a thickness equal to that of the gate control layer, the drain insulating material region has a thickness equal to that of the bit line connection layer, and a projection area of the MOS through-hole is greater than a projection area of the corresponding bit line pillar connection; and etch vertical MOS through-holes at positions corresponding to the bit line pillar connections in the initial gate electrode material regions and the initial drain insulating material regions until the bit line pillar connections are exposed. The Center of the MOS through-hole and that of the bit line pillar connection are aligned on the z-axis, while the MOS through-hole has a larger area than the bit line pillar connection, as shown in FIG. 8 to FIG. 9.

Figures 10, 11:
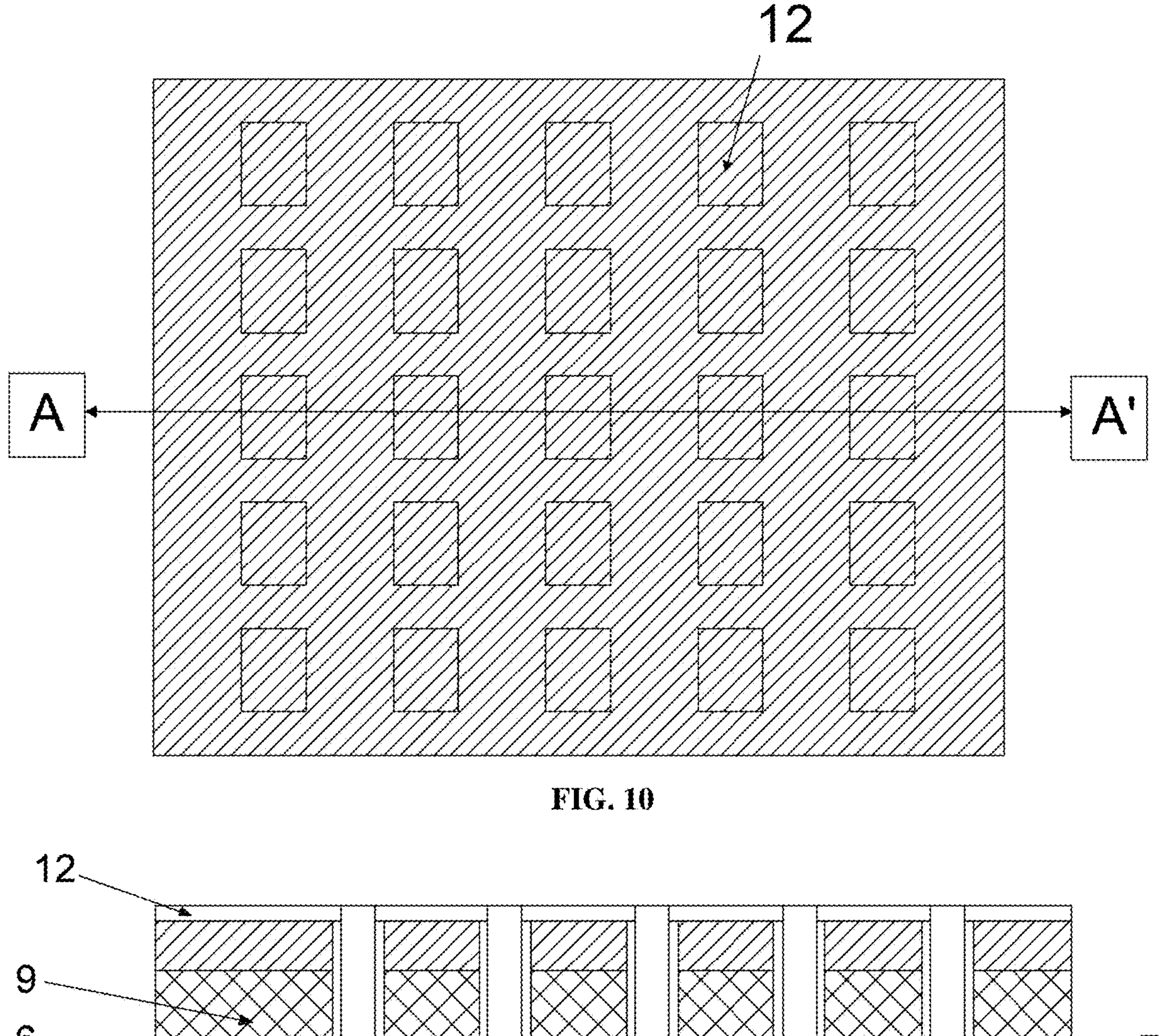
FIG. 10 is a fifth schematic diagram of an intermediate process for preparing a three-dimensional memory according to Embodiment 3 of the present disclosure.
FIG. 11 is a sixth schematic diagram of an intermediate process for preparing a three-dimensional memory according to Embodiment 3 of the present disclosure.
Figures 12, 13:
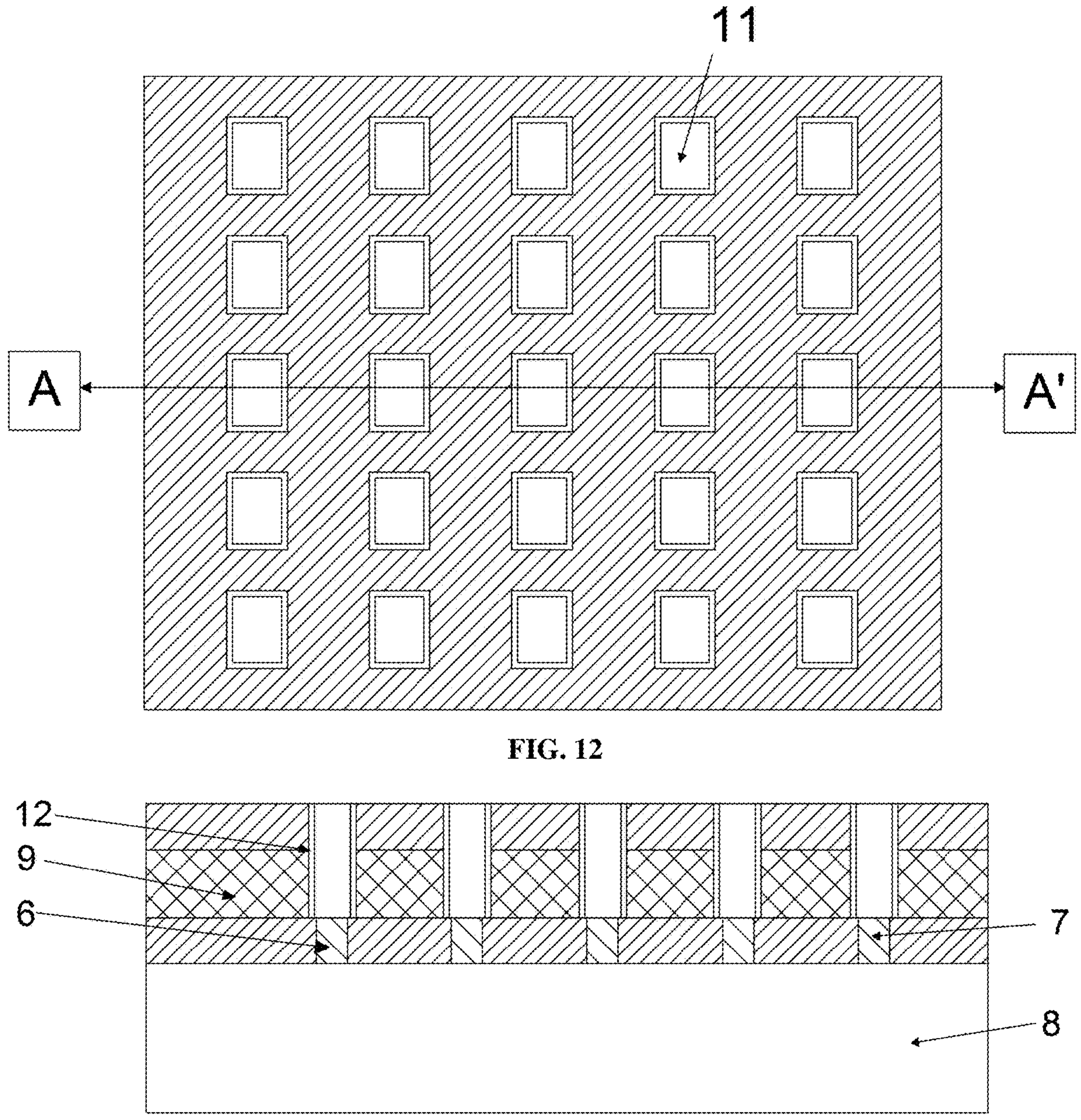
FIG. 12 is a seventh schematic diagram of an intermediate process for preparing a three-dimensional memory according to Embodiment 3 of the present disclosure.
FIG. 13 is an eighth schematic diagram of an intermediate process for preparing a three-dimensional memory according to Embodiment 3 of the present disclosure.

Step 5: Uniformly deposit an insulating material on upper surfaces of the drain insulating material regions, sidewalls of the MOS through-holes, and the bottoms of the MOS through-holes, as shown in FIG. 10 to FIG. 11; etch the insulating material on the upper surfaces of the drain insulating material regions and the bottoms of the MOS through-holes to form second through-holes surrounded by the gate insulating material, where a projection area of the second through-hole is less than or equal to a projection area of the corresponding bit line pillar connection; uniformly deposit the gate insulating material 12, and then vertically etch the gate insulating material to remove the gate insulating material from the top of an entire device and the bottoms of the MOS through-holes, as shown in FIG. 12 and FIG. 13. This process is fully self-aligned, using a vertical etching technique to selectively etch the insulating material, thus removing the insulating material from the unprotected top and the bottoms of the MOS through-holes. The sidewall material of the MOS through-hole is protected due to the high anisotropy of the etching technique. Therefore, no mask is required for this step. In this case, the insulating material of the MOS through-hole forms the second through-hole.

Figures 14, 15:
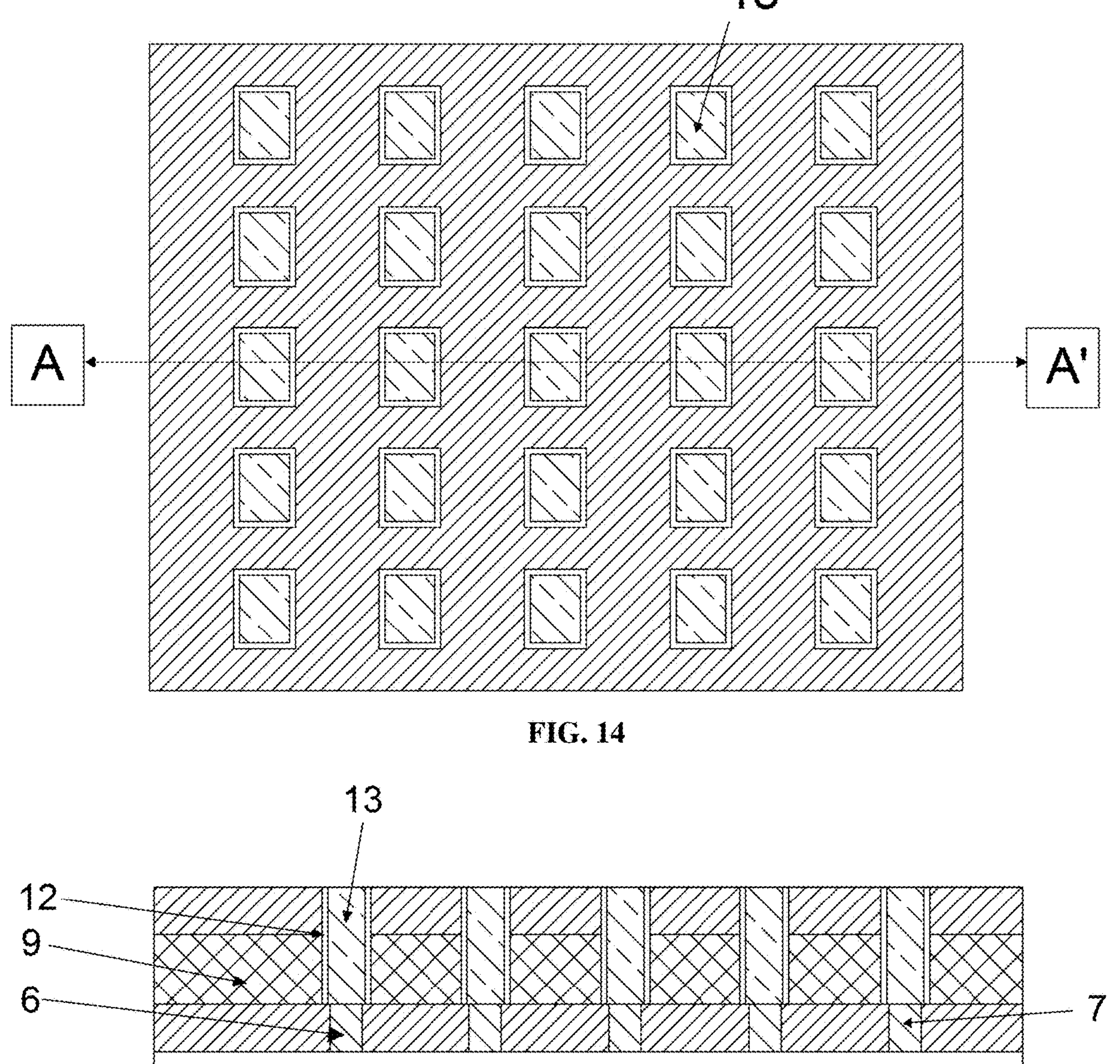
FIG. 14 is a ninth schematic diagram of an intermediate process for preparing a three-dimensional memory according to Embodiment 3 of the present disclosure.
FIG. 15 is a tenth schematic diagram of an intermediate process for preparing a three-dimensional memory according to Embodiment 3 of the present disclosure.

Step 6: Fill the second through-hole with a MOS channel material 13 to obtain an initial MOS channel material region, where the second through-hole is filled with a MOS channel material (such as p-type poly-Si) to obtain an initial MOS channel material region, as shown in FIG. 14 to FIG. 15.

Figure 16:
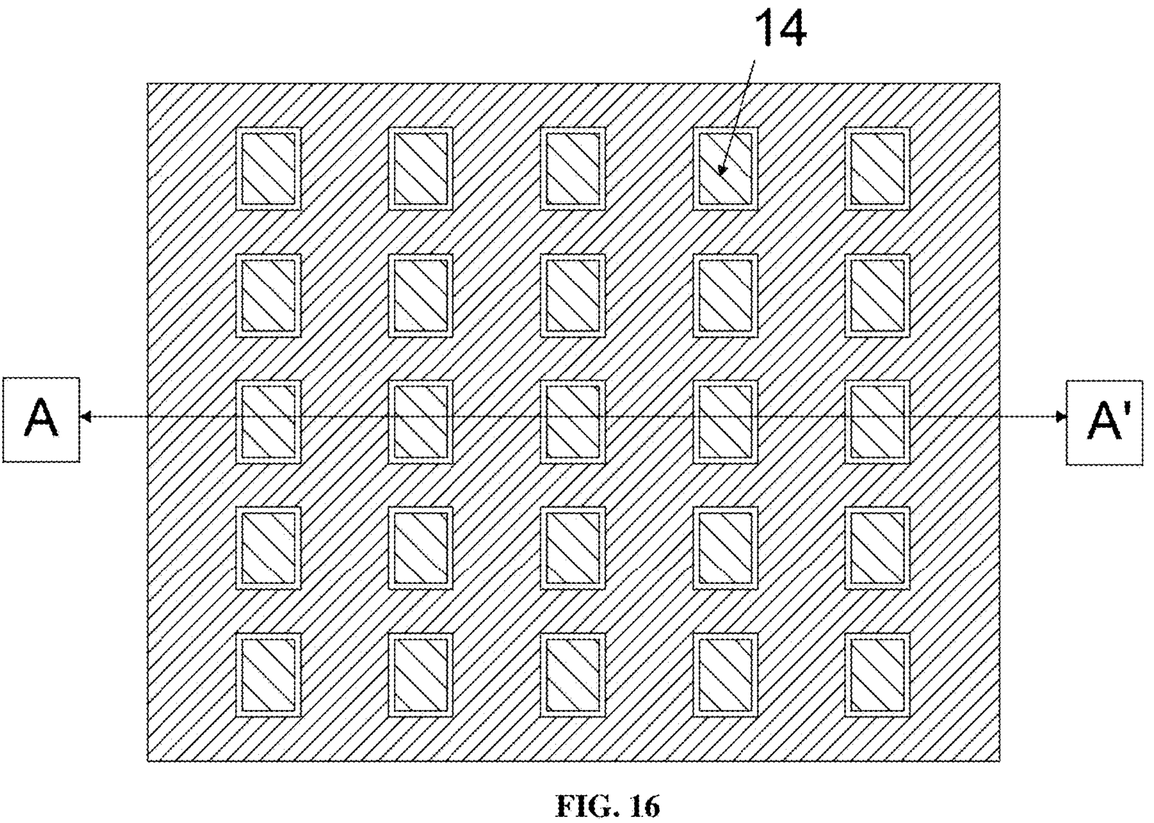
FIG. 16 is an eleventh schematic diagram of an intermediate process for preparing a three-dimensional memory according to Embodiment 3 of the present disclosure.
Figure 17:
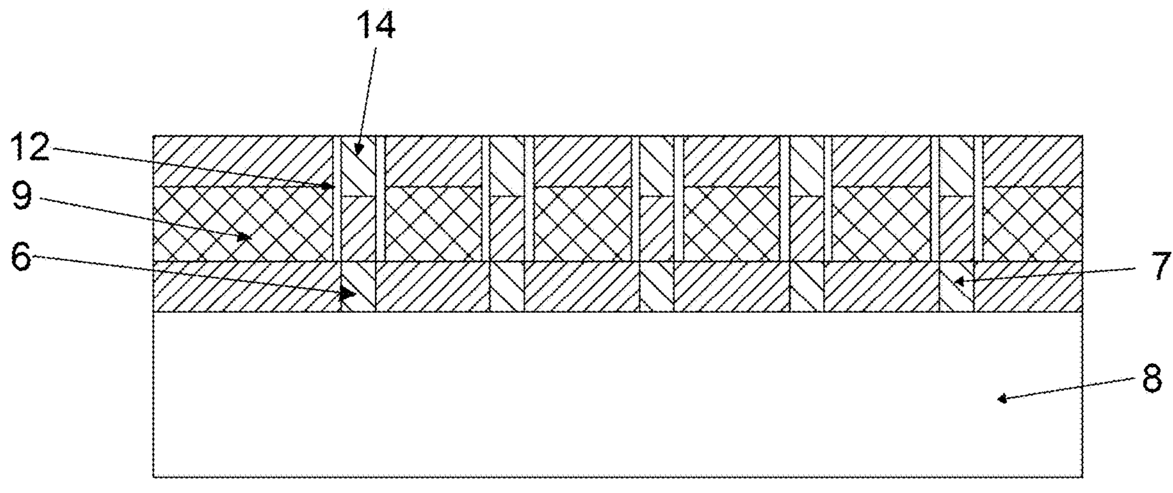
FIG. 17 is a twelfth schematic diagram of an intermediate process for preparing a three-dimensional memory according to Embodiment 3 of the present disclosure.

Step 7: Set a drain material at a position corresponding to the drain insulating material region in the second through-hole; set the drain material at a position corresponding to the bit line connection layer in the second through-hole to form a drain material region, as shown in FIG. 16 to FIG. 17, where impurities (n-type) opposite in type to a channel doping type (p-type) are injected from the top of a MOS channel to form the drain material (such as n+ poly-Si), and the bottom of the drain material region is flush with or slightly lower than the bottom of the drain insulating material layer.

Step 8: Connect an upper surface of the drain material region to a corresponding vertical bit line of OTP devices in a OTP array layer prepared subsequently, to obtain a three-dimensional memory. By connecting the upper surface of the drain electrode material layer to the vertical bit lines of the corresponding OTP devices in the OTP array layer prepared subsequently, a three-dimensional memory is obtained, as shown in FIG. 1.

The preparation of the OTP device is an existing technology. By ensuring a sufficient connection between the vertical bit line in the OTP device and the drain at the upper end of a HVBD unit, the connection can be established.

The gate electrode material is n+ poly-Si, and the material of the drain insulating material layer is silicon dioxide. The material of the MOS channel material layer is p-type poly-Si, and the material of the drain electrode material layer is n+ poly-Si.

In this embodiment, the vertical MOS transistors of the HVBDs (HVBD) are positioned at bit line connections between the multi-layer stacked OTP array and the bit line decoder array to prevent the risk of breakdown of the gate insulating layer of the MOS selection transistors in the decoder array using the 1.1V MOS transistor process. The working principle is to connect the source and drain of the vertical MOS transistor to a multi-layer stacked OTP array end and a bit line decoder array end, respectively, and to take the control by applying a gate control voltage ($V_{dh}$) to the gate of the vertical MOS transistor. Vah is constantly above a MOS turn-on voltage ($V_t$) ($V_{dh}>V_t$). During operation, if a programming voltage Vp (6-6.5V) is applied to memory cells corresponding to one word line (WL) and a plurality of bit lines (BL) simultaneously, before successfully programmed, all memory cells are in a high resistance (insulating) state, with minimal current flowing through the BL. The MOS transistor of the HVBD operates in a linear region, with similar voltages at the source and drain, which does not affect normal programming. Once programming succeeds, the memory cell is in a low resistance (turn-on) state. In this case, although the voltage on the vertical bit line BL at the multi-layer stacked OTP array is high (close to 6-6.5V), due to the control of $V_{dh}$, the HVBD operates in a saturation region of the vertical MOS transistor, and a voltage difference $V_{ds}$ between the source and drain can be large. Therefore, the vertical MOS transistor operating in the saturation region has a relatively high channel resistance, bearing most of the voltage. Generally, the voltage at the drain of the vertical MOS transistor does not exceed the gate voltage (which usually set to around 2.5V), ensuring that the MOS gate insulating layer in the decoder array connected thereto below will not be broken down by a high voltage. Therefore, the application of the HVBDs in the present disclosure is particularly suitable for a 3D memory that requires programming with a high programming voltage and programming driven by a high current. It should be noted that if the gate insulating layer of the vertical MOS transistor of the HVBD is too thin, there is also a risk of breakdown by the high programming voltage. Therefore, in the process of preparing the HVBD, it is necessary to ensure that the gate insulating layer of the vertical MOS transistor is thick enough to provide high-voltage blocking.

Embodiment 4

Figure 18:
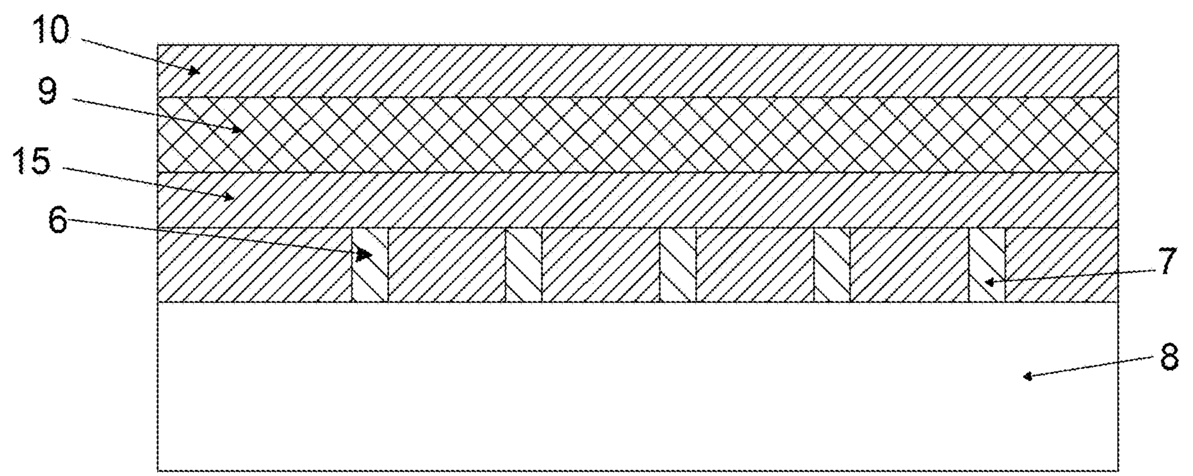
FIG. 18 is a first schematic diagram of an intermediate process for preparing a three-dimensional memory according to Embodiment 4 of the present disclosure.

This embodiment provides a preparation method for a three-dimensional memory, which is different from Embodiment 3 in that:

Between the step 1 and the step 2, the method further includes:

A source layer insulating material is deposited on the decoder array connection layer to obtain initial source insulating material regions, as shown in FIG. 18.

Figure 19:
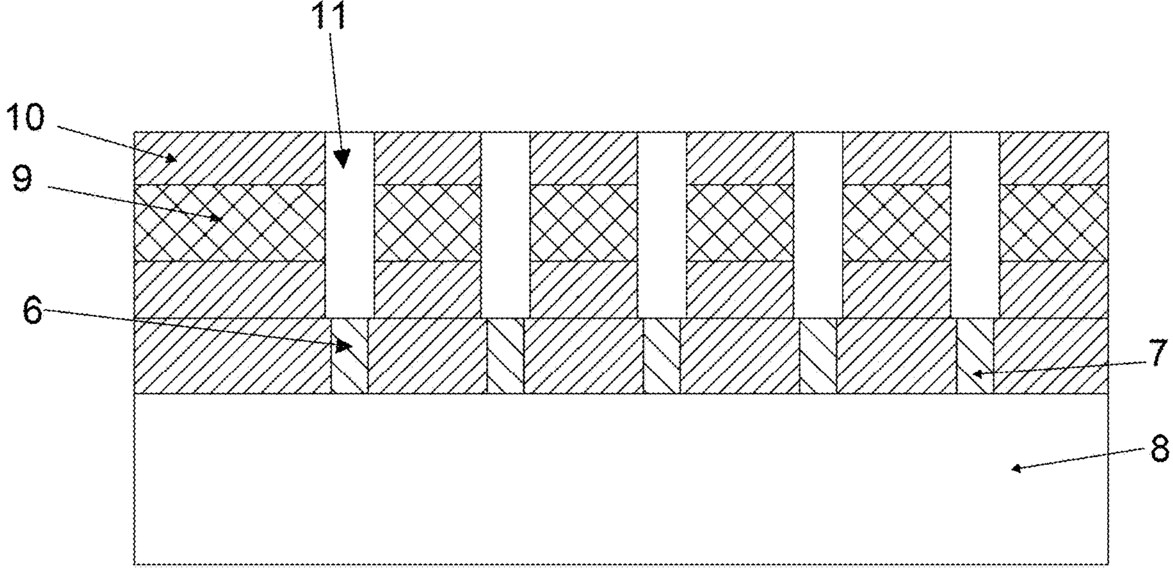
FIG. 19 is a second schematic diagram of an intermediate process for preparing a three-dimensional memory according to Embodiment 4 of the present disclosure.

MOS through-holes are etched at positions corresponding to the MOS through-holes on the initial source insulating material regions, the initial gate electrode material regions, and the initial drain insulating material regions to obtain source insulating material regions, gate electrode material regions, and drain insulating material regions, where a projection area of the MOS through-hole is larger than that of the corresponding bit line pillar connection, as shown in FIG. 19.

Figure 20:
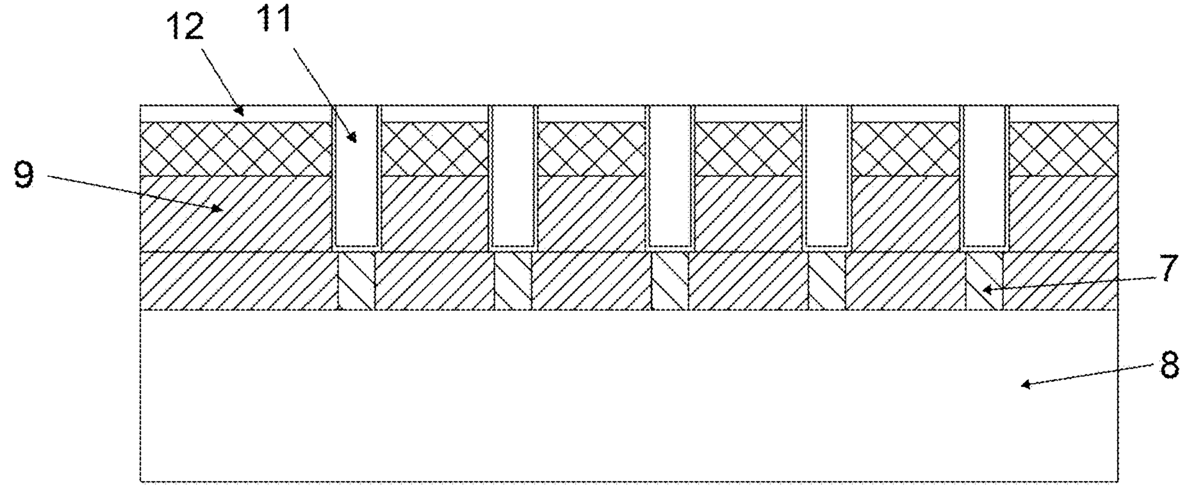
FIG. 20 is a third schematic diagram of an intermediate process for preparing a three-dimensional memory according to Embodiment 4 of the present disclosure.
Figure 21:
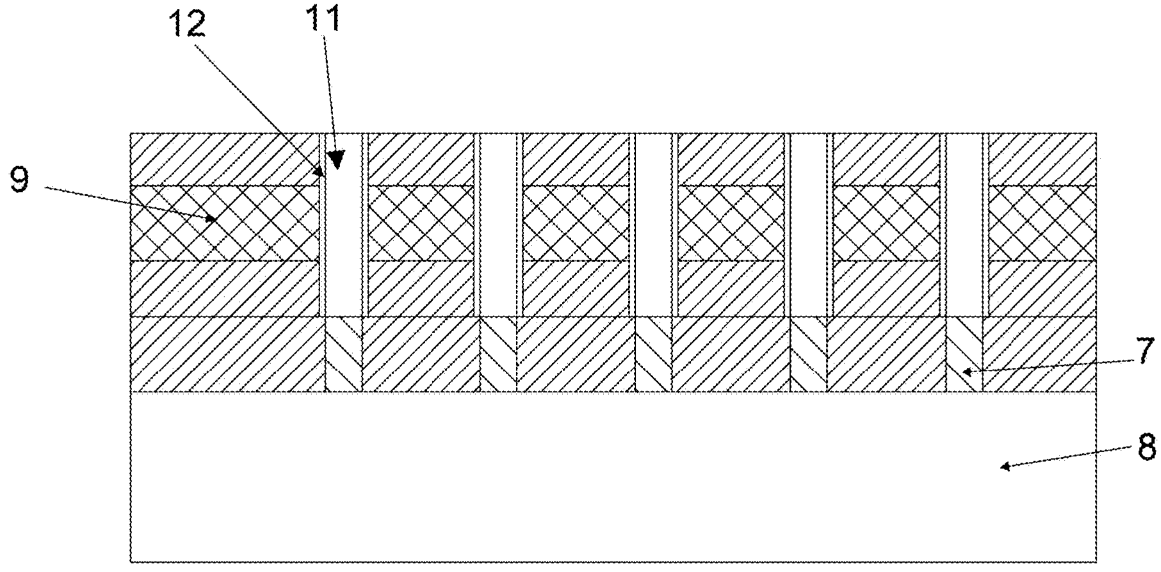
FIG. 21 is a fourth schematic diagram of an intermediate process for preparing a three-dimensional memory according to Embodiment 4 of the present disclosure.
Figure 22:
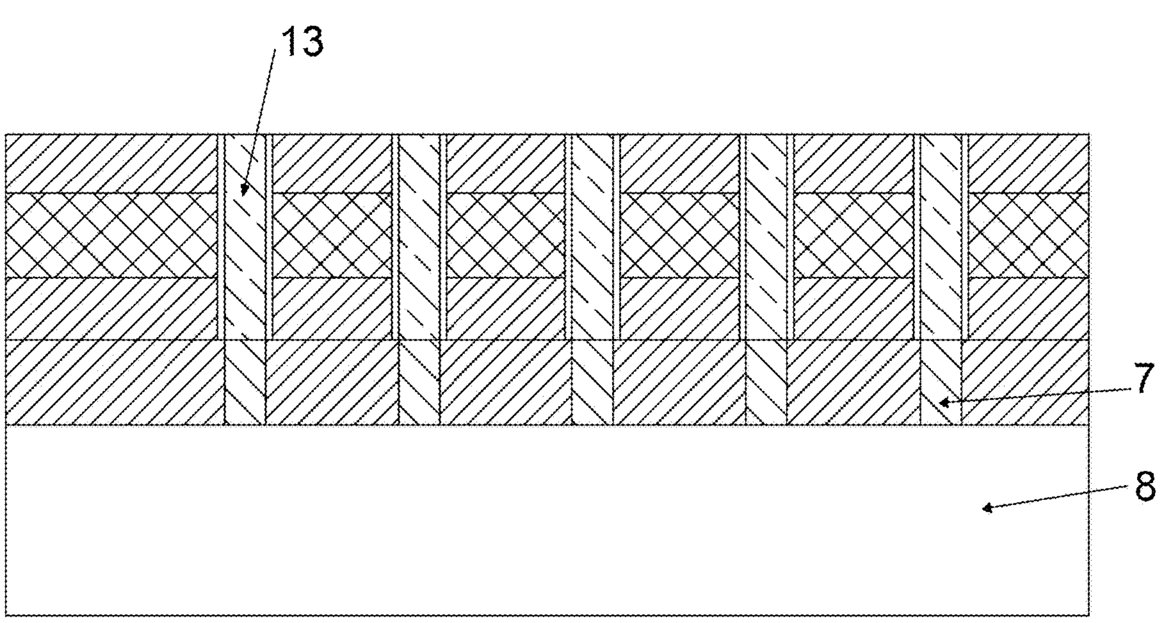
FIG. 22 is a fifth schematic diagram of an intermediate process for preparing a three-dimensional memory according to Embodiment 4 of the present disclosure.
Figure 23:
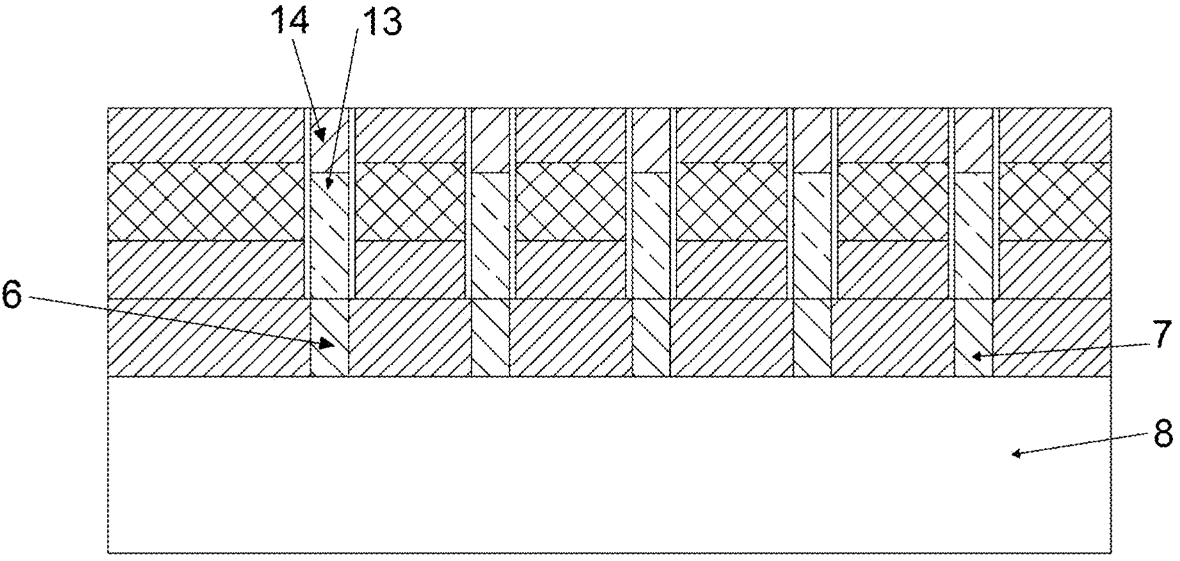
FIG. 23 is a sixth schematic diagram of an intermediate process for preparing a three-dimensional memory according to Embodiment 4 of the present disclosure.
Figure 24:
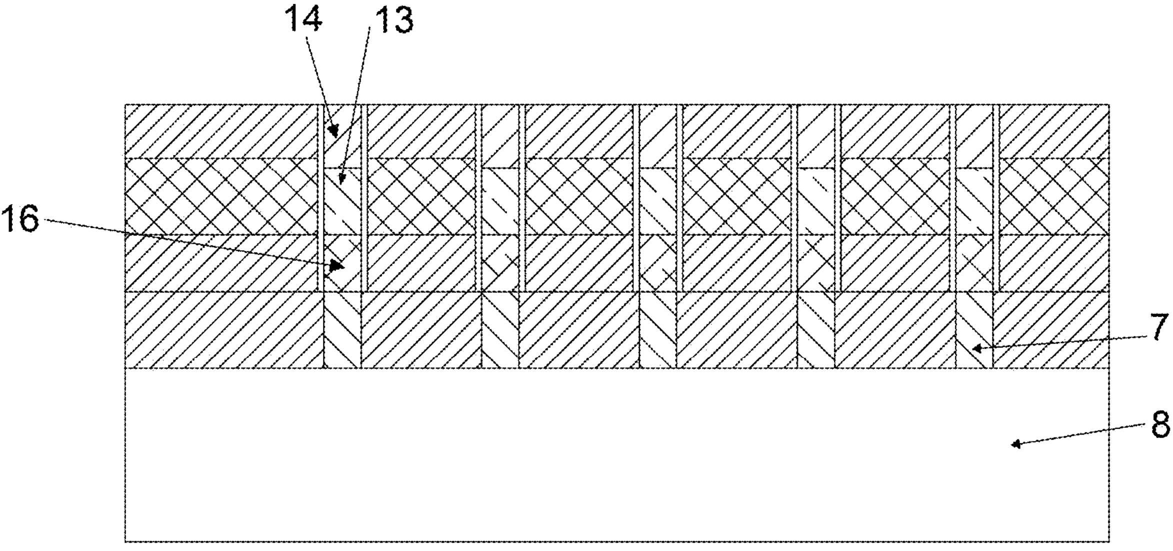
FIG. 24 is a seventh schematic diagram of an intermediate process for preparing a three-dimensional memory according to Embodiment 4 of the present disclosure.
Figure 25:
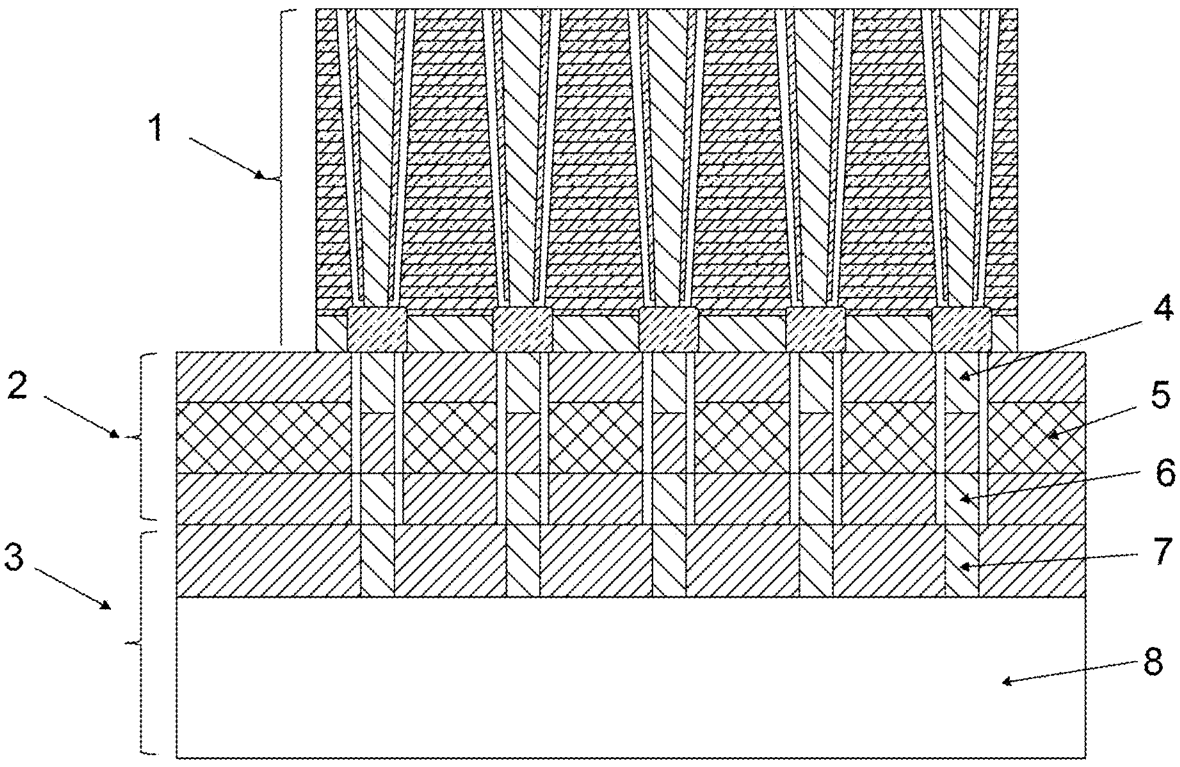
FIG. 25 is an eighth schematic diagram of an intermediate process for preparing a three-dimensional memory according to Embodiment 4 of the present disclosure.

An insulating material is uniformly deposited over an entire area, as shown in FIG. 20, and then the insulating material is vertically etched to remove the insulating material on the top and the insulating material at the bottoms of the MOS through-holes, as shown in FIG. 21, to form second through-holes surrounded by a gate insulating material, where a projection area of the second through-hole is smaller than or equal to that of the corresponding bit line pillar connection; the second through-holes are filled with a MOS channel material to obtain initial MOS channel material regions, as shown in FIG. 22. A drain material is set at positions corresponding to the bit line decoder array in the second through-hole to form a drain material region, as shown in FIG. 23; impurities are diffused from the bit line pillar connection in the decoder array connection layer into the bottom of a MOS channel, to form a source material region 16 in a source layer defined by the source insulating material region formed in the foregoing step, as shown in FIG. 24; and an upper surface of the drain electrode material layer is connected to vertical bit lines of corresponding OTP devices in a OTP array layer prepared subsequently, to obtain a three-dimensional memory, as shown in FIG. 25.

The step of etching the vertical MOS through-holes further includes: etching MOS through-holes at positions corresponding to the MOS through-holes on the initial source insulating material regions, the initial gate electrode material regions, and the initial drain insulating material regions to obtain source insulating material regions, gate electrode material regions, and drain insulating material regions from bottom to top.

Forming of the drain material region 14 and the source material region 16 requires ion implantation and diffusion processes. Split lines between the MOS channel material region 13 and these two parts generally do not align completely with the upper and lower edges of the gate electrode material layer 9. Typically, to ensure the operation of the vertical MOS, the split line between the drain material region 14 and the MOS channel material region 13 needs to be lower than or flush with the plane corresponding to the upper edge of the gate electrode material layer 9, while the split line between the source material region 16 and the MOS channel material region 13 needs to be higher than or flush with the plane corresponding to the upper edge of the gate electrode material layer 9.

After forming the drain material region, the method further includes:

diffusing impurities from the bit line pillar connection in the decoder array connection layer into the bottom of a MOS channel, to form a source material region in a source layer defined by the source insulating material region formed in the foregoing step, as shown in FIG. 19.

In summary, while ensuring normal read and write operations, the present disclosure effectively prevents the MOS selection transistor with small footprint but a thin gate insulating layer from breakdown. Using vertical MOS devices as basic units of HVBDs, the process is easy to implement, and there are no special requirements for optimizing the performance of the HVBD, provided that the gate insulating layer of the vertical MOS transistor is not broken down in long-term operation. Therefore, the process is simple and cost-effective.

Each embodiment in the description is described in a progressive way, each embodiment focuses on differences from other embodiments, and references can be made to each other for the same and similar parts between embodiments. Since the system disclosed in an embodiment corresponds to the method disclosed in an embodiment, the description is relatively simple, and for related contents, references can be made to the description of the method.

Particular examples are used herein for illustration of principles and implementation modes of the present disclosure. The descriptions of the above embodiments are merely used for assisting in understanding the method of the present disclosure and its core ideas. In addition, those of ordinary skill in the art can make various modifications in terms of particular implementation modes and the scope of application in accordance with the ideas of the present disclosure. In conclusion, the content of the description shall not be construed as limitations to the present disclosure.

What is claimed is:

1. A high-voltage blocking device (HVBD), wherein the HVBD is applied to a three-dimensional memory, and the three-dimensional memory comprises a bit line decoder array layer, a HVBD layer, and a one-time programmable (OTP) array layer that are sequentially arranged from bottom to top;

metal oxide semiconductor (MOS) bit line selection transistors in the bit line decoder array layer are connected to vertical bit lines of OTP devices in the OTP array layer in a one-to-one corresponding manner through the HVBDs in the HVBD layer; and the HVBD is a vertical MOS transistor;

the HVBD layer comprises a plurality of HVBDs;

a plurality of vertical MOS through-holes are provided on the HVBD layer; the HVBDs are arranged to be in a one-to-one correspondence with the vertical MOS through-holes; the HVBDs are embedded in the HVBD layer through the corresponding vertical MOS through-holes;

the HVBD layer comprises a decoder array connection layer, a gate control layer, and a bit line connection layer that are sequentially arranged from bottom to top; and the decoder array connection layer, the gate control layer, and the bit line connection layer are each provided with a plurality of MOS through-holes; the MOS through-holes on the decoder array connection layer, the MOS through-holes on the gate control layer, and the MOS through-holes on the bit line connection layer are in a one-to-one correspondence and coaxially arranged; the vertical MOS through-holes comprise the MOS through-holes on the decoder array connection layer, the MOS through-holes on the gate control layer, and the MOS through-holes on the bit line connection layer that are coaxially arranged.

2. The HVBD according to claim 1, wherein the HVBD comprises: a MOS channel material region and a drain material region sequentially arranged from bottom to top in the vertical MOS through-hole; the MOS channel material region is embedded in the gate control layer, and the drain material region is embedded in the bit line connection layer;

a bit line pillar connection led out by the MOS selection transistor in the bit line decoder array layer is embedded in the decoder array connection layer; the bit line pillar connection is in contact with a lower surface of the MOS channel material region, and an upper surface of the drain material region is in contact with the vertical bit line of the OTP device in the OTP array layer; an upper surface of the MOS channel material region is in contact with a lower surface of the drain material region, allowing the MOS selection transistor in the bit line decoder array layer to be correspondingly connected to the vertical bit line of the OTP device in the OTP array layer via the HVBD; and side surfaces of the MOS channel material region and the drain material region are covered with a gate insulating material.

3. The HVBD according to claim 2, wherein the HVBD layer further comprises: a source layer;

the source layer is positioned under the gate control layer; and the source layer is provided with a plurality of MOS through-holes; the MOS through-holes on the decoder array connection layer, the MOS through-holes on the source layer, the MOS through-holes on the gate control layer, and the MOS through-holes on the bit line connection layer are in a one-to-one correspondence and coaxially arranged; the MOS through-hole on the decoder array connection layer, the MOS through-hole on the insulating material layer, the MOS through-hole on the gate control layer, and the MOS through-hole on the bit line connection layer together form one vertical MOS through-hole.

4. The HVBD according to claim 3, wherein the HVBD comprises: a source material region, a MOS channel material region, and a drain material region sequentially arranged from bottom to top in the vertical MOS through-hole; the source material region is embedded in the source layer; the MOS channel material region is embedded in the gate control layer; and the drain material region is embedded in the bit line connection layer;

a bit line pillar connection led out by the MOS selection transistor in the bit line decoder array layer is embedded in the decoder array connection layer, and is in contact with a lower surface of the source material region in the HVBD, and an upper surface of the drain material region is in contact with the vertical bit line of the OTP device in the OTP array layer; the source material region, the MOS channel material region, and the drain material region are in contact successively, allowing the MOS selection transistor in the bit line decoder array layer to be correspondingly connected to the vertical bit line of the OTP device in the OTP array layer via the HVBD; and side surfaces of the source material region, the MOS channel material region, and the drain material region are covered with the gate insulating material.

5. The HVBD according to claim 4, wherein a main part of the gate control layer is made of a gate electrode material; and the main part is a region other than the MOS channel material region and the gate insulating material.

6. The HVBD according to claim 5, wherein the gate electrode material is made of heavily-doped polysilicon;

the gate insulating material is silicon dioxide;

the source material region is made of heavily-doped n-type polysilicon;

the bit line pillar connection is made of heavily-doped n-type polysilicon;

the MOS channel material region is made of lightly-doped p-type polysilicon; and the drain material region is made of heavily-doped n-type polysilicon.

7. A three-dimensional memory, using the HVBD according to claim 1.

8. The three-dimensional memory according to claim 7, wherein the HVBD comprises: a MOS channel material region and a drain material region sequentially arranged from bottom to top in the vertical MOS through-hole; the MOS channel material region is embedded in the gate control layer, and the drain material region is embedded in the bit line connection layer;

a bit line pillar connection led out by the MOS selection transistor in the bit line decoder array layer is embedded in the decoder array connection layer; the bit line pillar connection is in contact with a lower surface of the MOS channel material region, and an upper surface of the drain material region is in contact with the vertical bit line of the OTP device in the OTP array layer; an upper surface of the MOS channel material region is in contact with a lower surface of the drain material region, allowing the MOS selection transistor in the bit line decoder array layer to be correspondingly connected to the vertical bit line of the OTP device in the OTP array layer via the HVBD; and side surfaces of the MOS channel material region and the drain material region are covered with a gate insulating material.

9. The three-dimensional memory according to claim 8, wherein the HVBD layer further comprises: a source layer;

the source layer is positioned under the gate control layer; and the source layer is provided with a plurality of MOS through-holes; the MOS through-holes on the decoder array connection layer, the MOS through-holes on the source layer, the MOS through-holes on the gate control layer, and the MOS through-holes on the bit line connection layer are in a one-to-one correspondence and coaxially arranged; the MOS through-hole on the decoder array connection layer, the MOS through-hole on the insulating material layer, the MOS through-hole on the gate control layer, and the MOS through-hole on the bit line connection layer together form one vertical MOS through-hole.

10. The three-dimensional memory according to claim 9, wherein the HVBD comprises: a source material region, a MOS channel material region, and a drain material region sequentially arranged from bottom to top in the vertical MOS through-hole; the source material region is embedded in the source layer; the MOS channel material region is embedded in the gate control layer; and the drain material region is embedded in the bit line connection layer;

a bit line pillar connection led out by the MOS selection transistor in the bit line decoder array layer is embedded in the decoder array connection layer, and is in contact with a lower surface of the source material region in the HVBD, and an upper surface of the drain material region is in contact with the vertical bit line of the OTP device in the OTP array layer; the source material region, the MOS channel material region, and the drain material region are in contact successively, allowing the MOS selection transistor in the bit line decoder array layer to be correspondingly connected to the vertical bit line of the OTP device in the OTP array layer via the HVBD; and side surfaces of the source material region, the MOS channel material region, and the drain material region are covered with the gate insulating material.

11. The three-dimensional memory according to claim 10, wherein a main part of the gate control layer is made of a gate electrode material; and the main part is a region other than the MOS channel material region and the gate insulating material.

12. The three-dimensional memory according to claim 11, wherein the gate electrode material is made of heavily-doped polysilicon;

the gate insulating material is silicon dioxide;

the source material region is made of heavily-doped n-type polysilicon;

the bit line pillar connection is made of heavily-doped n-type polysilicon;

the MOS channel material region is made of lightly-doped p-type polysilicon; and the drain material region is made of heavily-doped n-type polysilicon.

13. A preparation method for a three-dimensional memory, comprising:

preparing a bit line decoder array layer;

using an upper surface of the bit line decoder array layer, on which bit line pillar connections led out by metal oxide semiconductor (MOS) selection transistors in the bit line decoder array layer are located, as a decoder array connection layer of a high-voltage blocking device (HVBD), wherein a plurality of bit line pillar connections on the bit line decoder array layer are embedded in vertical MOS through-holes in a one-to-one corresponding manner;

depositing a gate electrode material on the decoder array connection layer to obtain initial gate electrode material regions;

depositing a drain insulating material on the initial gate electrode material regions, to obtain initial drain insulating material regions;

etching MOS through-holes at positions corresponding to the MOS through-holes in the initial gate electrode material regions and the initial drain insulating material regions to obtain gate electrode material regions and drain insulating material regions, wherein the gate electrode material region has a thickness equal to a thickness of a gate control layer, the drain insulating material region has a thickness equal to a thickness of a bit line connection layer, and a projection area of the MOS through-hole is greater than a projection area of the corresponding bit line pillar connection;

uniformly depositing an insulating material on upper surfaces of the drain insulating material regions, sidewalls of the MOS through-holes, and the bottoms of the MOS through-holes; etching the insulating material on the upper surfaces of the drain insulating material regions and the bottoms of the MOS through-holes to form second through-holes surrounded by a gate insulating material, wherein a projection area of the second through-hole is less than or equal to a projection area of the corresponding bit line pillar connection;

filling the second through-holes with a MOS channel material, to obtain initial MOS channel material regions;

setting a drain material at positions corresponding to the drain insulating material regions in the second through-holes, to obtain a drain material region; and connecting an upper surface of the drain material region to vertical bit lines of corresponding one-time programmable (OTP) devices in a OTP array layer prepared subsequently, to obtain a three-dimensional memory.

14. The preparation method for a three-dimensional memory according to claim 13, wherein before depositing the gate electrode material on the decoder array connection layer to obtain the initial gate electrode material regions, the preparation method further comprises:

depositing a source layer insulating material on the decoder array connection layer to obtain initial source insulating material regions.

15. The preparation method for a three-dimensional memory according to claim 14, wherein after depositing the source layer insulating material on the decoder array connection layer to obtain the initial source insulating material regions, the preparation method further comprises:

etching MOS through-holes at positions corresponding to the MOS through-holes on the initial source insulating material regions, the initial gate electrode material regions, and the initial drain insulating material regions to obtain source insulating material regions, gate electrode material regions, and drain insulating material regions, wherein a projection area of the MOS through-hole is larger than a projection area of the corresponding bit line pillar connection.

* * * * *